United States Patent
Caupain et al.

(10) Patent No.: US 7,462,807 B2
(45) Date of Patent: Dec. 9, 2008

(54) BEVELED ERGONOMIC IMAGE RECORDER WITH BENT READING REGISTER

(75) Inventors: Jean-Marie Caupain, Gieres (FR);
Gérard Beal, Saint-Egreve (FR);
Thierry Ligozat, Grenoble (FR)

(73) Assignee: Atmel Grenoble (FR)

( * ) Notice: Subject to any disclaimer, the term of this patent is extended or adjusted under 35 U.S.C. 154(b) by 31 days.

(21) Appl. No.: 10/562,686

(22) PCT Filed: Jun. 25, 2004

(86) PCT No.: PCT/EP2004/051242

§ 371 (c)(1),
(2), (4) Date: Apr. 12, 2006

(87) PCT Pub. No.: WO2005/004239

PCT Pub. Date: Jan. 13, 2005

(65) Prior Publication Data

US 2006/0237625 A1    Oct. 26, 2006

(30) Foreign Application Priority Data

Jul. 1, 2003    (FR) .................................. 03 07978

(51) Int. Cl.
*H01L 27/00* (2006.01)
*H01J 40/14* (2006.01)
(52) U.S. Cl. .................................. 250/208.1; 250/239
(58) Field of Classification Search .............. 250/208.1, 250/226, 370.08, 370.09, 370.11, 239; 348/294, 348/302–305, 309–311, 316–324, 332; 257/290–294, 257/222, 225, 226, 231–233; 378/168, 98.8; 600/473, 475, 589, 590
See application file for complete search history.

(56) References Cited

U.S. PATENT DOCUMENTS 5,291,010 A    3/1994    Tsuji .................... 250/208.1
5,510,623 A *    4/1996    Sayag et al. ........... 250/370.11

(Continued)

FOREIGN PATENT DOCUMENTS

EP    0 729 269    3/1996

(Continued)

OTHER PUBLICATIONS

Abstract of EP 0729 269 Mar. 1, 1996.
Abstract of WIPO 00 79598 A Dec. 28, 2000.

*Primary Examiner*—Que T. Le
*Assistant Examiner*—Pascal M Bui-Pho
(74) *Attorney, Agent, or Firm*—Lowe Hauptman Ham & Berner, LLP

(57) ABSTRACT

The invention relates to small dimension image recorders, such as an image recorder, comprising a matrix of rows and columns of photosensitive points, arranged on a chip of a generally square or rectangular form with believed corners, characterised in comprising a reading register arranged at the base of the matrix. The register is bent to follow the bevelled corners of the chip and thus comprises a horizontal piece and two oblique pieces. The sensor further comprises means ($ZI_n$) to direct the photosensitive charges form the columns terminating opposite the beveled corners towards the stage of the reister situated in the oblique part along the beveled corners. The above is of application to intraoral dental radiological sensors.

8 Claims, 5 Drawing Sheets

U.S. PATENT DOCUMENTS

| | | | | |
|---|---|---|---|---|
| 6,153,874 A | * | 11/2000 | Monoi | 250/208.1 |
| 6,527,442 B2 | * | 3/2003 | Carroll | 378/189 |
| 6,794,654 B1 | * | 9/2004 | Hansen et al. | 250/370.09 |
| 2002/0100922 A1 | | 8/2002 | Hiroo et al. | 257/222 |

FOREIGN PATENT DOCUMENTS

| | | |
|---|---|---|
| EP | 1255401 A1 | 5/2001 |
| WO | 00 79598 A | 12/2000 |

* cited by examiner

BEVELED ERGONOMIC IMAGE RECORDER WITH BENT READING REGISTER

FIELD OF THE INVENTION

The invention relates to image sensors of small dimensions.

The application more especially aimed at here is image capture inside the human body, which requires such sensors. There is in particular a need for dental radiological sensors which are introduced into the mouth of a patient to allow radiological observation of his jaw and his dentition. The ergonomics of use and the comfort of the patient are very important elements to be taken into account in the production of these sensors.

BACKGROUND OF THE INVENTION

The image sensor is an electronic sensor with matrix structure, consisting of an array of rows and columns with a photosensitive dot at the crossover of each row and each column. Electronic circuits are provided on the sides of the matrix to ensure the operation thereof and in particular lateral registers for controlling the row conductors and a register at the bottom of the columns for ensuring the reading of the signals detected by the individual circuits. In the case of a radiological sensor, the array is covered with a scintillator to convert X-rays into light and the luminous image resulting therefrom is detected by the array of photosensitive dots.

The matrix structure of the image sensor is in general made on a semiconductor chip of square or rectangular shape as is done for almost all integrated circuits. However, to improve the ergonomics, a proposal has already been made to make the sensor on a chip with beveled corners. After encapsulation of the chip in a protective package which hugs the shape of the chip and rounds off the corners, the sensor has a shape which is more comfortable for the patient than if the chip were rectangular.

FIG. 1 represents a chip two corners of which are beveled; these are the corners situated "at the top" in the figure, in principle at the front of the sensor in the direction of introduction of the sensor into the mouth of the patient. The signals detected by the matrix are dumped vertically from the matrix to a horizontal reading register situated at the bottom of the matrix, hence here on the rear side in the direction of introduction of the sensor, just where there are no beveled corners. The charges are then dumped horizontally by the horizontal register to an output of this register. This solution is effective in respective of comfort while introducing the sensor into the mouth; it is less so in respect of comfort while removing the sensor from the mouth.

This is why one also seeks to make a sensor having a chip with four beveled corners, that is more ergonomic both in respect of introduction into the mouth and in respect of removal. However, the room required to place a reading register at the bottom of the matrix is then no longer available.

A solution to this problem has been proposed in patent U.S. Pat. No. 5,510,623. It consists in placing a reading register vertically in the middle of the matrix, as is represented in FIG. 2, rather than horizontally at the bottom of the matrix.

In that case, the charges are dumped horizontally from the two half-matrices, left and right, to the central vertical register, then they are discharged by the vertical register to a central output situated at the bottom of the sensor. The ergonomics of the sensor is optimized by virtue of the four beveled corners, but the image is perturbed in the central zone of the sensor on account of the presence of the vertical register, even if the vertical register is itself photosensitive.

SUMMARY OF THE INVENTION

The invention proposes a solution for deriving maximum benefit from the ergonomic advantages of a chip with four beveled corners without perturbing picture capture at the center of the matrix.

For this purpose, the invention proposes an image sensor comprising a matrix of rows and columns of photosensitive dots, made on a chip of general square or rectangular shape with beveled corners, characterized in that it comprises a reading register placed at the bottom of the matrix, this register being bent so as to run alongside the beveled corners of the chip and therefore comprising a horizontal part and two oblique parts, and the sensor furthermore comprising means for directing photosensitive charges of columns terminating opposite the beveled corners to register stages situated in the oblique parts alongside the beveled corners.

The means for directing the charges to the oblique part of the register include in particular insulation zones between columns of the matrix, these zones being bent so as to aid the transfer of charges to the oblique part of the register. Moreover, certain of the row electrodes which serve for the transfer of charges in the vertical direction, and which extend linearly in the shape of a horizontal strip along the matrix, are preferably bent at their end so that at the crossover of a row end and a column end in immediate proximity to the oblique part of the register, the end of the last electrode comprises a part extending parallel to the oblique part of the register. The electrodes which immediately precede this last electrode have shapes intermediate between a horizontal strip and the bent strip constituting the end of the last electrode so as to facilitate the transfer of charges to the oblique part of the register.

The reading register may have an output situated on the right or on the left. However, it preferably has a central output, that is to say it is divided into two half-registers operating in opposite senses so as to bring the charges from the left half of the matrix to the right and the charges from the right half to the left. The register may in this case have either two central outputs side by side, one for each half-register, or a single central output, the charges of the two half-registers being dumped alternately to one and the same reading circuit which multiplexes the signals arising from the two half-registers.

The presence of a register along a beveled corner in a matrix structure modifies the order of succession of the signals extracted from the matrix, and requires that this order be restored during the utilization of the signals for the reconstruction of a global image. Means of reconstruction of the order of the image dots, as a function of the exact configuration of the beveled corners and of the register which follows their contour, must therefore be envisaged, either on the sensor itself (on the chip) or off the sensor.

BRIEF DESCRIPTION OF DRAWINGS

Other characteristics and advantages of the invention will become apparent on reading the detailed description which follows and which is offered with reference to the appended drawings in which.

DESCRIPTION OF PREFERRED EMBODIMENTS

The invention will be described in regard to an intraoral dental radiological sensor although it is applicable to other cases where similar problems of bulkiness, comfort and ergonomics would arise.

Figure 1:
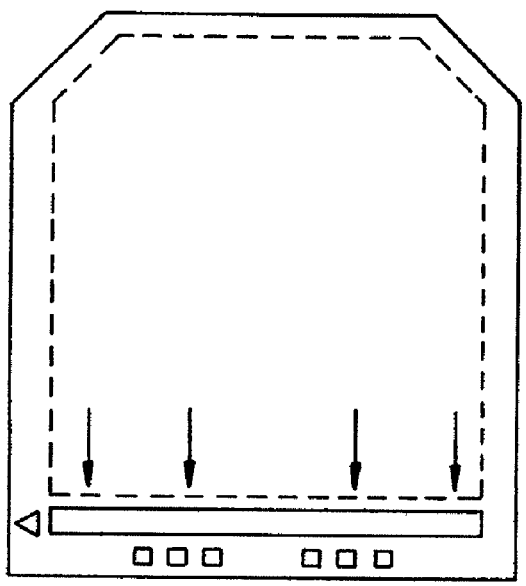
FIG. 1, already mentioned, represents a dental image sensor whose chip comprises two beveled corners.
Figure 2:
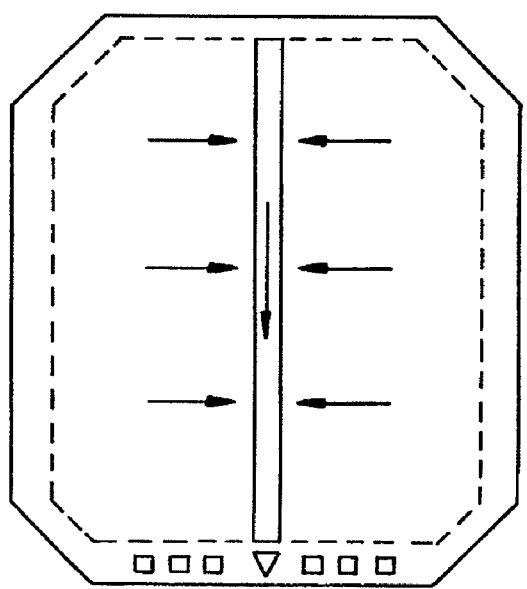
FIG. 2, likewise already mentioned, represents a sensor whose chip comprises four beveled corners.
Figure 3:
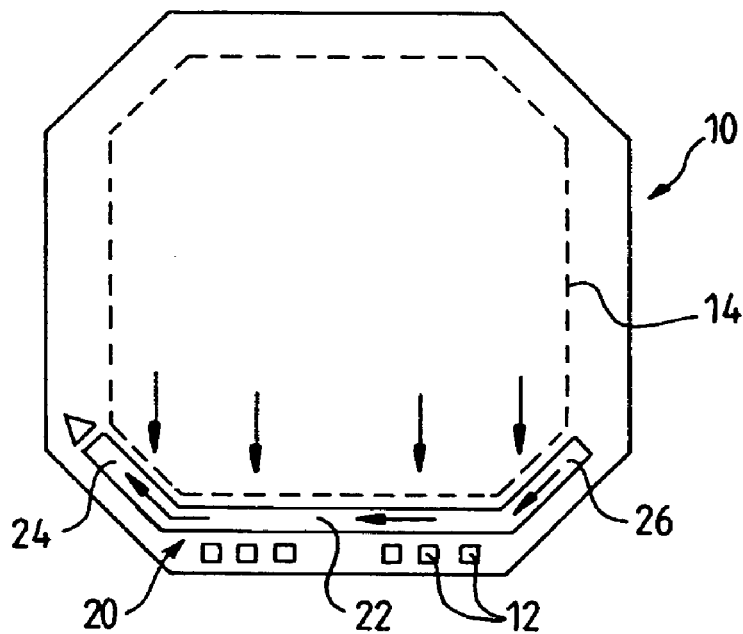
FIG. 3 represents the principle of a sensor according to the invention, with a lateral output of the "horizontal" reading register.

FIG. 3 represents an electronic chip 10 according to the invention, intended to be encapsulated in a package substantially hugging the shape of the chip; the electronic chip comprises four main sides, top, bottom, right, left, which are pairwise perpendicular, and it exhibits four beveled corners which interrupt the main sides before they cross one another. The chip will be mounted on a base (not represented), of the same rectangular shape with four beveled corners, and it will be linked to this base by bonding wires internal to the package and soldered on one side to the base and on the other to the bonding pads 12 provided on the chip. The chip and base assembly is enclosed in a leaktight package (not represented) which hugs the rectangular shape with beveled corners of the chip and of the base and which preferably has rounded corners for comfort and ergonomics. Bonding wires for connection to the outside, linked to the base, exit this package, on one side only which is preferably but not necessarily the bottom side of the figure, so that a single bundle of wires, not represented, situated at the bottom of the sensor, leaves the sensor so as to be linked to an outside apparatus; these wires serve for the electrical supply to the sensor and for gathering the electrical signals representing the image detected by the sensor; for an intraoral sensor, this bundle of wires exits the mouth of the patient during radiological picture capture of the inside of the mouth; the top side of the figure is the upstream side in the direction of introduction of the sensor into the mouth of a patient.

The sensor is a matrix sensor consisting of an array of rows and columns of photosensitive dots, each photosensitive dot gathering electric charges in proportion to the exposure of this dot to light. The active zone proper, comprising these photosensitive dots, is a zone 14, of rectangular shape with beveled corners like the shape of the chip, represented here by its perimeter shown dashed. Around this zone are housed the electronic circuits necessary for the operation of the matrix, and in particular the registers for controlling rows. The active zone therefore comprises a bottom side, a top side, a right side and a left side, which are the four sides that may be referred to as rectangular, and it also comprises a bottom left beveled corner, a bottom right beveled corner, a top left beveled corner, and a top right beveled corner.

The angles of the beveled corners depend on the ratio between the spacing of the rows and the spacing of the columns of the matrix. Preferably, the spacing is the same row-wise and column-wise (for example 20 micrometers) and the beveled corners are then 45°, this being the easiest to produce.

The electric charges gathered by the photosensitive dots are transferred vertically column-wise to the bottom of the matrix where they are dumped into a reading register (that will be referred to as a "horizontal" register by analogy with the customary reading registers which are disposed horizontally at the bottom of the matrix); dumping is effected according to a conventional method consisting in transferring the charges vertically from one row to the next, simultaneously for all the rows of the matrix, the last row being transferred into the horizontal register, in reading the row contained in the reading register, in performing a new vertical transfer step, and so on and so forth.

According to the invention, the so-called "horizontal" reading register 20, which transfers to an output the charges that it has received after a step of vertical shifting of the matrix, runs alongside the two beveled corners of the bottom of the matrix. The register therefore comprises a horizontal part 22 along the bottom side of the active zone, and two oblique parts 24 and 26, respectively along the bottom left side and along the bottom right side of the active zone. This of course raises technical problems that will be detailed hereinbelow. The charges of the various columns are dumped not only into the horizontal part 22 of the register, along the bottom side of the chip, but also directly from the columns of the matrix to the oblique parts 24 and 26 of the register.

In a first embodiment, represented in FIG. 3, the reading register comprises a single output situated at the distal end (furthest from the horizontal part 22) of the oblique part 24 (or 26) of the register.

Figure 4:
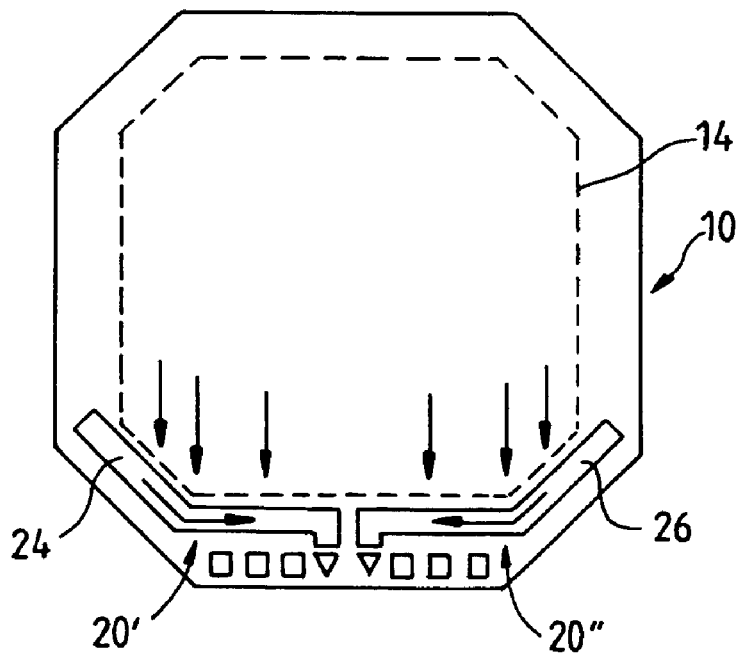
FIG. 4 represents a sensor with two central outputs.

In a second embodiment, represented in FIG. 4, there are two half-registers 20' and 20", one on the left, the other on the right; each half-register comprises a half of the horizontal part and a respective oblique part, left for the half-register 20', right for the half-register 20". The half-registers may have outputs at the ends of the oblique parts, in a configuration much like that of FIG. 3 but with two symmetric outputs. However, they may also have outputs side by side, at the adjacent ends of the halves of horizontal parts of the registers, hence at the center of the bottom side of the matrix, as is represented in FIG. 4.

Figure 5:
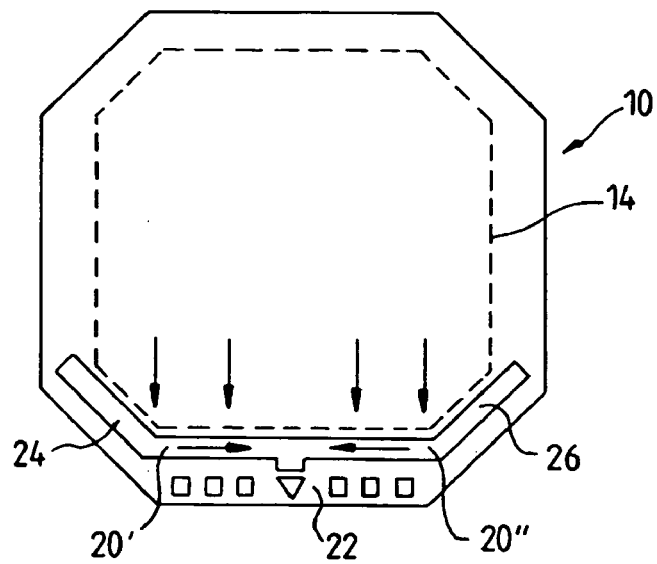
FIG. 5 represents a sensor with a multiplexed single central output.

In a third embodiment, represented in FIG. 5, the two half-registers 20' and 20" have a single output at the center of the bottom side of the matrix, and this output provides alternately, in a multiplexed manner, the charges originating from the left side and from the right side of the matrix of photosensitive dots. The signals must thereafter be demultiplexed to reconstruct an image line.

The first embodiment allows a simple layout of the register and simplifies the design of the control of the register. However, it does not make it possible to optimize the use of the chip zone available between the left (or right) edge of the active zone and the left (or right) edge of the chip.

The second embodiment makes it possible to bring the edge of the active zone closer to the left or right edge of the chip, hence to increase the area of the image capture zone for one and the same chip area, but it compels a complication in the layout of the output of the registers. Moreover, the existence of two outputs entails a risk of imbalance between the left half and the right half of the image. Also the consumption of the outputs is bigger.

The third embodiment also makes it possible to bring the edge of the active zone closer to the edge of the chip. The layout of the output is simpler than in the second solution. This third solution makes it possible to optimize the dimensions of the chip, to circumvent certain dispersions in gain between different outputs, and to minimize consumption by virtue of the use of a single reading amplifier.

Figure 6:
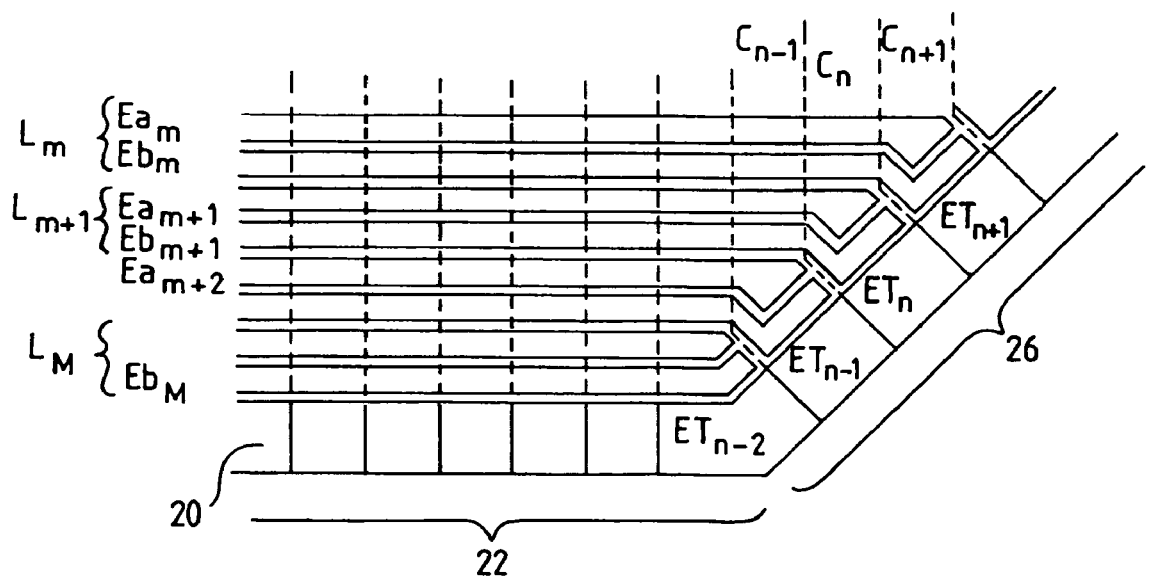
FIG. 6 represents the basic shape of the electrodes allowing dumping of the charges into the output register at the level of the beveled corners.

FIG. 6 represents a schematic layout of electrodes making it possible to efficiently dump the charges into a bent register from columns which do not arrive perpendicularly to the register in the oblique parts of the latter.

The reading register 20 is represented in its part situated at the corner between the horizontal part 22 and the oblique part 26 of the register.

The matrix of the active zone has horizontal rows $L_m$, $L_{m+1}$, for the rows of rank m and m+1 respectively etc., and to simplify the explanations it has been assumed, in the case of FIG. 6, that each row comprises two electrodes only: an electrode Ea of type a, an electrode Eb of type b (electrodes $Ea_m$, $Eb_m$ for the row of rank m, $Ea_{m+1}$, $Eb_{m+1}$ for a following row). The electrodes are all intimately adjacent to one another in order to effect the charge transfers. It is also assumed for simplicity that the last electrode $Eb_M$ of the last row of the matrix, that is to say the row of rank M, closest to the reading register, is immediately adjacent to the reading register.

The matrix also has vertical columns $C_n$, $C_{n+1}$, etc., mutually insulated (typically by P-type diffusions when the charge transfer and storage surface zones are of N type) so as to avoid a lateral transfer of charges, these columns behaving, by virtue of the row electrodes, as vertical shift registers, that is to say that during a phase of reading of the image stored in the matrix in the form of electric charges, the charges of the pixels of a column are shifted vertically row by row in this column and the charges of the last row are dumped at the end of the column.

Whereas over the whole of a conventional matrix the row electrodes are horizontal straight strip-like conductors over the entire length of the matrix, with a single electrode of type b ($Eb_m$) adjacent to a horizontal register over its entire length and a single electrode of type a ($Ea_m$) adjacent over its entire length to the electrode $Eb_m$, it is seen that here it is necessary to adopt a special design of electrodes of type a and of type b or a special design of the reading register in order that a succession of two electrodes of type a then b is adjacent to the register even in the oblique part of the register.

The reading register could rise staircase fashion along the oblique edge of the matrix zone; this staircase configuration would have the advantage of permitting the electrodes of type a and of type b to remain theoretically straight over their entire length, including at their end adjacent to the oblique part 26 of the reading register. However, a staircase configuration of the reading register is less effective in respect of charge transfer.

In FIG. 6, the register has by choice been given a straight rather than staircase configuration in its oblique part 26. A particular configuration is then given to the ends of row electrodes which terminate at the register. Moreover, the vertical transfer of charges to the register is aided by turning the columns toward the register. This is done by bending perpendicularly to the register the insulation zones which separate the columns from one another (these insulation zones are symbolized by the dotted lines in FIG. 6).

It is assumed, in FIG. 6, that the column $C_n$ of rank n terminates at the register at the location where the row $L_{m+1}$ of rank m+1 terminates at the register. That is to say, it is row $L_{m+1}$ which constitutes the last row into which the charges of column $C_n$ will be transferred before these charges are dumped into the register; and these charges will then be transferred into a stage $ET_n$ of the register, dedicated to column $C_n$. More precisely, it is electrode $Eb_{m+1}$ which constitutes the last electrode in column $C_n$; the electrode $Ea_{m+1}$ constitutes the last but one electrode.

We shall be concerned only with the columns of the right half-matrix, it being understood that the left half-matrix is generally symmetric with the right half-matrix.

The electrode $Eb_{m+1}$ of row $L_{m+1}$ is straight and parallel to the horizontal part 22 of the reading register, except at its end; that is to say this electrode is straight and horizontal when it crosses the successive columns up to rank n−1, but it ceases to be straight, in the configuration of FIG. 6, when it crosses the column of rank n.

At this location, the end of the electrode $Eb_{m+1}$ of row $L_{m+1}$ is bent in such a way that a part of the electrode now extends parallel to the stage $ET_n$ of the oblique register 26. The bend is firstly a downward bends, perpendicular to the oblique part of the register, then an upward bend parallel to the register.

In the same way, the shape of the electrode $Ea_{m+1}$ is that of a straight strip while it crosses the columns of the matrix up to the column of rank n−1; however, at the location where it crosses the column of rank n, it adopts another shape, such that it remains intimately adjacent both to the straight electrode which immediately precedes it (here: $Eb_m$) on one side and to the bent electrode $Eb_{m+1}$ on the other side.

In the direction of the shifting of charges in the oblique zones of the reading register, the spacing of the stages of the register is increased all the more when the inclination of the beveled corner is large. For a 45° beveled corner, the spacing is increased in the ratio square root of 2. The horizontal register is itself composed of a succession of mutually adjacent electrodes (for example two or four electrodes per stage of the register); these electrodes are not represented in FIG. 6; they are wider in the oblique part 26 of the register, just where the spacing of the registers is widest, than in the horizontal part 22.

The register stage constituting the transition where the register passes from a horizontal configuration to an oblique configuration, here the stage referenced $ET_{n-2}$ may be larger than the other stages (lengthwise in the direction of flow of the charges in the register) as is represented in FIG. 6. However, it may be preferable to cut it into several elements, for example into two half-stages, the transfer of charges in the register not being as good if the register electrodes are too wide (width in the direction of flow of the charges). However, if stage $ET_{n-2}$ is cut into two, it will be understood that only one of the two half-stages has to receive charges from the column (here column $C_{n-2}$) which emerges opposite stage $ET_{n-2}$. An insulation barrier (p+ diffusion for example) is therefore placed in front of the other half-stage so as to separate it from the adjacent columns ($C_{n-2}$ as much as $C_{n-1}$). This half-stage receiving no charges from the columns, this must be taken into account when utilizing the signal output by the horizontal register: a "hole" will be present in the series of pixel values that emanates from the register, this hole corresponding to a virtual site between the columns $C_{n-2}$ and $C_{n-1}$. If the register's horizontal stages comprise two electrodes, the two half-stages constituting stage $ET_{n-2}$ also comprise two electrodes each.

In FIG. 6, for ease of explanation, ends of electrodes of type b that are mutually independent have been represented. However, in a column-wise charge transfer register, all the electrodes of type a are controlled simultaneously and all the electrodes b are controlled simultaneously. The arrangement of FIG. 6 makes it possible to link the electrodes of type b to one another, forming a single continuous electrode along the oblique part of the register since they are practically adjacent to one another just where they run alongside this oblique part. Such is not the case for the electrodes of type a which remain physically separated from one another but which have to be linked together electrically by other means that will be detailed later.

With a register thus configured with a horizontal part and an oblique part, a problem of utilization of the signals gathered by the reading register arises. Specifically, although conventionally on each occasion the reading register dumps to an output the signals corresponding to an image line, here there is a mixing of information between different rows.

If $S_{m,n}$ denotes the signal gathered in the photosensitive dot at the crossover of a row of rank m and of a column of rank n, a conventional reading register would provide the following signals in order in succession, assuming that only the right half of the matrix (columns 1 to N) is of concern and that the output of the register occurs towards the right:

$S_{M,1}, S_{M,2}, \ldots S_{M,N}$
then $S_{M-1,1}, S_{M-1,2}, \ldots S_{M-1,N}$
then $S_{M-2,1}, S_{M-2,2}, \ldots S_{M-2,N}$ etc.

However, in the invention, the order of the signals is shuffled, the information transmitted being in succession:

firstly the information $S_{M,1}, S_{M,2}, \ldots$ of row $L_M$ in the order of the columns for all the columns which are opposite the horizontal part of the register, then $S_{M,n-2}, S_{M-1,n-1}, S_{M-2,n}$, etc. if it is assumed that the oblique part of the register commences onward of column n−1, then the information $S_{M-1,1}, S_{M-1,2}, \ldots$ of row $L_{M-1}$ in the order of the columns for all the columns which are opposite the horizontal part of the register, then $S_{M-1,n-2}, S_{M-2,n-1}, S_{M-3,n}$, etc.

and so on and so forth.

Means (in principle a buffer memory) for reorganizing the order of the signals so as to allow the reconstruction of the image are therefore provided in the sensor or preferably outside the sensor.

Figure 7:
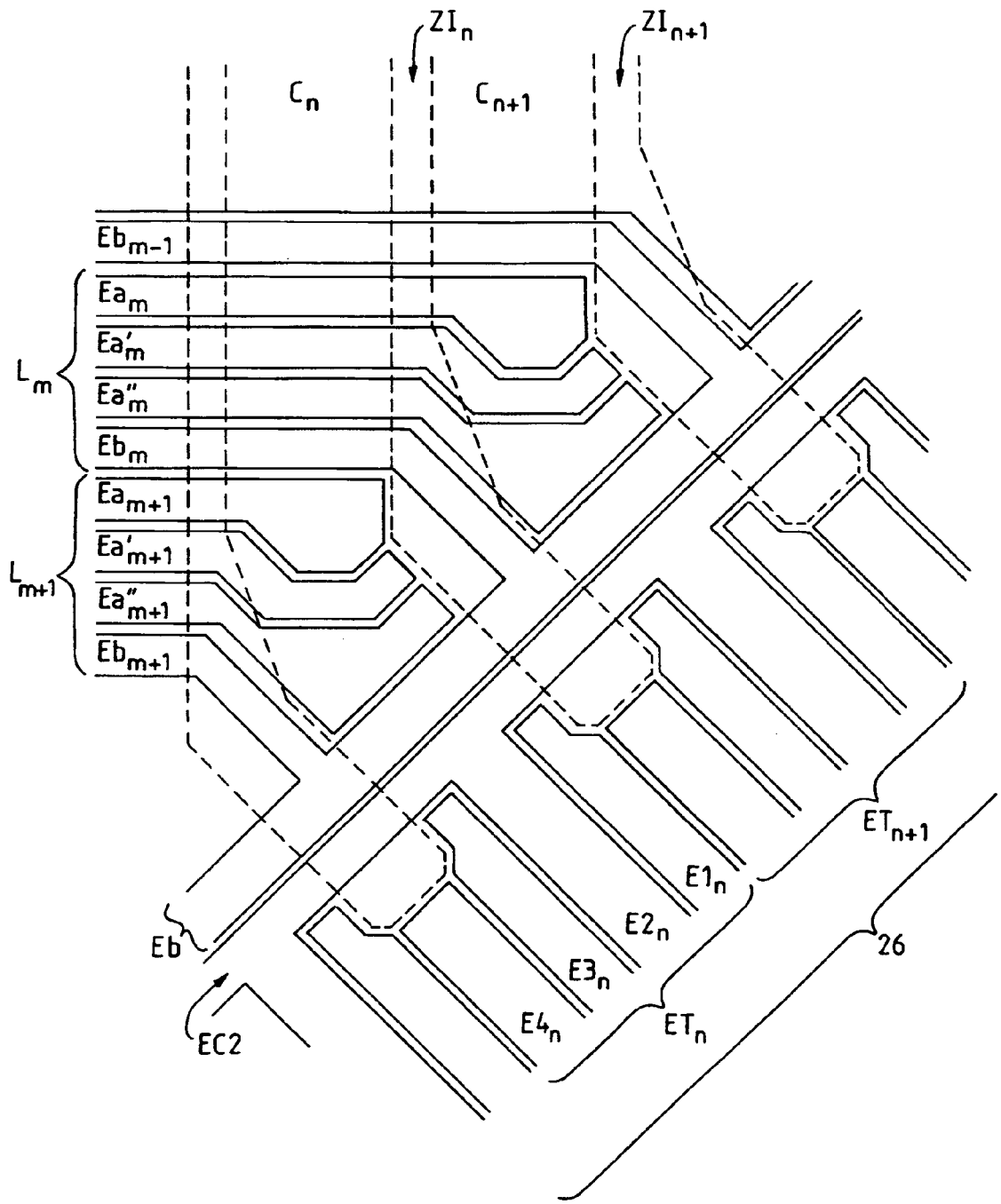
FIG. 7 represents an embodiment detail in the case where the columns of the matrix operate as a charge transfer register with four electrodes per register stage.

FIG. 7 represents a practical exemplary embodiment in the most general case where each row of the matrix comprises four adjacent electrodes controlled by signals allowing the progressive shifting of charges from one row to the next. In this example, the reading register also comprises four electrodes per register stage. Only a portion of oblique part 26 of the reading register is represented, with the intersection of two rows $L_m$, and $L_{m+1}$ and of two columns $C_n$ and $C_{n+1}$.

Each row comprises four electrodes, $Ea_m, Ea'_m, Ea''_m$, and $Eb_m$ for row $L_m$. The columns are delimited by insulation zones $ZI_n, ZI_{n+1}$, which channel the charges vertically inside a column and which are bent at their end perpendicularly to the register so as to channel the charges obliquely towards a respective stage $ET_n, ET_{n+1}$ of the reading register. The column end into which the transferred charges pass is therefore bent perpendicularly to the oblique register.

Just where a column and a row finish opposite a stage of the oblique part of the reading register, the four electrodes are deformed and cease to consist of a simple straight strip of constant width:

the electrode $Eb_m$, which is a straight strip provided that it has not arrived in front of the last column of rank n+1 is bent obliquely downwards (above the insulation zone $ZI_n$) then obliquely upwards above column $C_{n+1}$, the upward bend constituting an electrode portion which runs alongside the oblique register; all the electrodes $Eb_m$ are preferably attached to one another in the form of a single oblique conductor Eb which runs alongside the oblique register and which groups together all the obliquely upward bent parts of the electrodes $Eb_m$;

the electrodes $Ea_m, Ea'_m, Ea''_m$ have intermediate shapes making it possible to pass progressively from the horizontal straight strip shape of constant width possessed by electrode $Eb_{m-1}$ in the column $C_{n+1}$ to the oblique strip shape of electrode $Eb_m$ is this same column.

In this embodiment matters have been contrived such that the electrodes of row $L_m$ cease to have a straight strip shape only when they arrive in the last column $C_{n+1}$ but it would be conceivable for the deformation of the electrodes to commence slightly before, for example when they are still in the last but one column $C_n$, so as to facilitate, inside this column, the progressiveness of deformation of the electrodes from a horizontal strip shape to an oblique strip shape.

The reading register has in this example four electrodes per stage $E1_n, E2_n, E3_n, E4_n$ for stage $ET_n$. The charges originating from the column of rank n are dumped under electrode $E2_n$ when the latter is at an appropriate potential; all the electrodes $E2_n, E2_{n+1}$, etc. are joined together by a conductor EC2 extending along the reading register parallel to the conductor Eb.

In a conventional matrix, the control signals for the row electrodes would be conveyed via the ends of these electrodes on one side of the matrix. However, in the matrix according to the invention there is a difficulty since the ends of the electrodes are not easily accessible from the side of the matrix, just where these electrodes terminate in front of the oblique part of the register; this being so neither on the right nor on the left.

This is why provision is made for access metallizations of these electrodes to pass along the oblique register, above the electrodes, and to come into point contact with the electrodes that have to be powered. In the register with four electrodes per row of FIG. 7, provision is preferably made for four metallization lines Ma, Ma', Ma", Mb which run along the oblique register so as to come into contact respectively with the electrodes Ea, the electrodes Ea', the electrodes Ea", and the electrodes Eb. These lines are represented in FIG. 8.

These metallizations (preferably aluminum) must occupy as little room as possible since they mask the photosensitive zones situated along the reading register. Matters may be contrived such that in total they mask only one or two rows of photosensitive dots.

Figure 8:
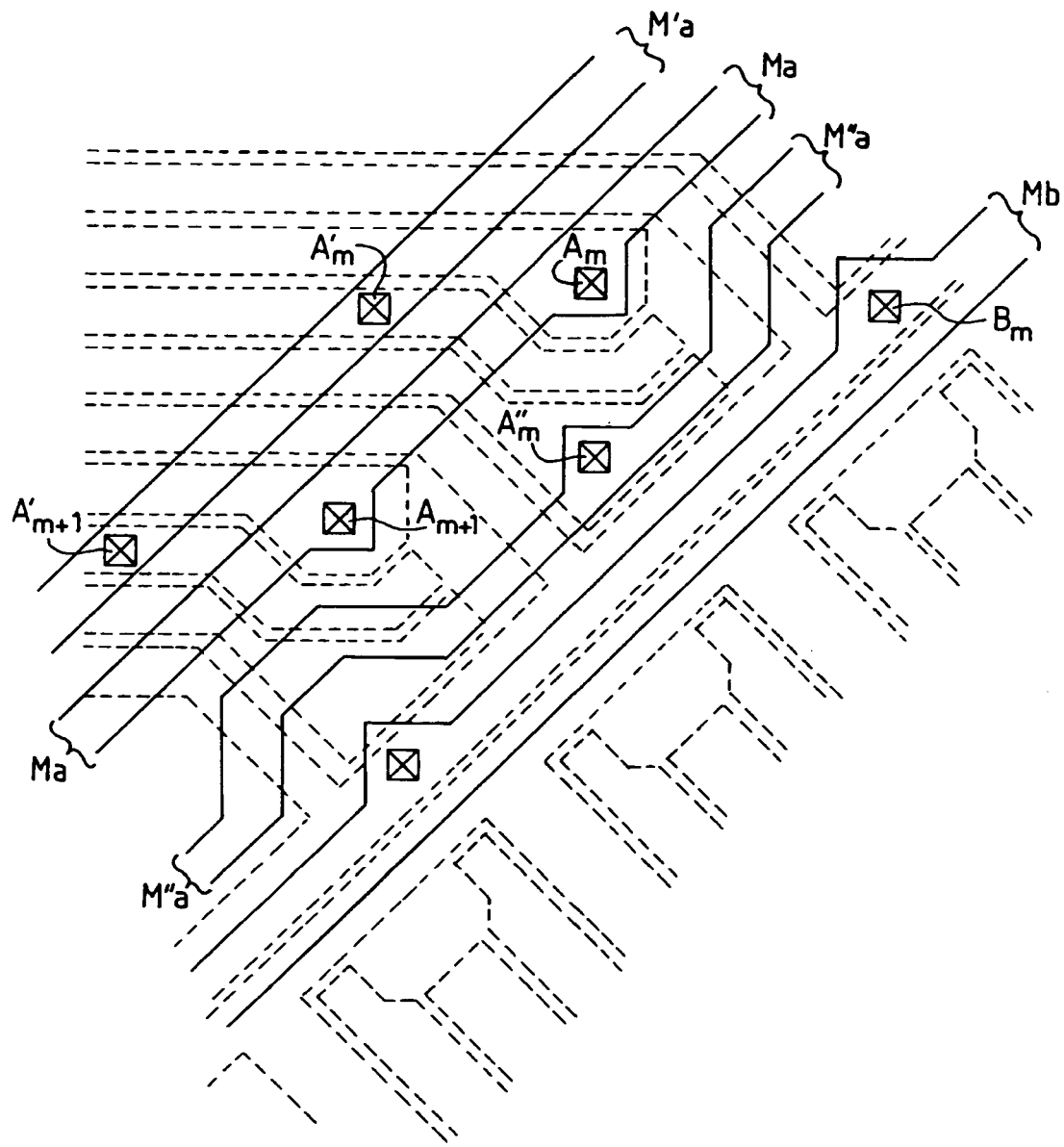
FIG. 8 represents the metallic conductors intended for conveying the control signals to the various row electrodes of the matrix of FIG. 7.

FIG. 8, superimposable on FIG. 7, shows the metallization lines that may be provided, and the zones where they contact the row electrodes so as to apply the desired control signals to them. The electrodes mentioned with reference to FIG. 7 are represented dotted in FIG. 8. The metal conductors which convey the control signals to them are represented as solid lines. The contact zones between a metal conductor and an electrode situated underneath (and insulated by an insulating layer interrupted at the location of the contacts) are represented by a square barred with a cross. The layout of the conductors is such that there is compliance at one and the same time with a sufficient width of the conductors (to ensure sufficient conductivity), a sufficient width at the location of the contacts (to avoid contact faults) and a sufficient gap between conductors (to avoid short-circuit faults).

There is point contact between the metallization Ma and the electrodes $Ea_m, Ea_{m+1}$, etc., at points $A_m, A_{m+1}$, etc.

There is point contact between the metallization Ma and the electrodes $Ea'_m, Ea'_{m+1}$, etc., at points $A'_m, A'_{m+1}$, etc.

There is point contact between the metallization Ma" and the electrodes of even rank $Ea''_m, Ea''_{m+2}$ etc. but not between the metallization Ma" and the electrodes of odd rank $Ea''_{m+1}$, if there is insufficient room (but more room could possibly be created by distancing the conductors Ma, Ma', Ma", Mb from one another or by using a different configuration). If the contact is not made with the electrodes of odd rank, provision must of course be made for contact with these electrodes at some other location, and this other location is quite simply the other side of the matrix (left side); specifically, the conductors Ma, Ma', Ma", Mb extending along the whole of the reading register both in its horizontal part and in its two oblique parts.

Finally, from place to place the metallization Mb contacts, at points $B_m$, the common electrode Eb which is linked, it will be recalled, to the electrodes $Eb_m$, $Eb_{m+1}$, etc. Provision need not be made for contact having the same periodicity as the spacing of the rows. In the example represented, contact is made one row out of two.

The matrix sensor thus made is covered with a scintillating layer before encapsulation if one wishes to make a radiological sensor, and in particular to make an intraoral dental radiological sensor.

The invention claimed is:

1. An image sensor comprising:
    a matrix of rows and columns of photosensitive dots, made on a chip of general square or rectangular shape with beveled corners,
    a reading register placed on the chip at the bottom of the matrix, said register having a horizontal part and two oblique parts running respectively along a horizontal part of the chip and two beveled corners of the chip and said matrix having columns terminating on the reading register on the horizontal part and columns terminating on the register on the two beveled parts of the register, said register including an input configured to store in parallel signals representative of exposure of pixels to light, and an output configured to serially output corresponding signals, and
    a structure for directing photosensitive charges of columns terminating opposite the beveled corners to register stages situated in the oblique parts alongside the beveled corners, said structure comprising insulating zones extending between adjacent columns of the matrix, parallel to said columns, wherein insulating zones which terminate on a beveled part of the register have terminal portions bent towards said beveled part.

2. The image sensor as claimed in claim 1, wherein each row of the matrix comprises several electrodes extending in a linear strip and in that the ends of certain of these electrodes are bent so that, inside a column terminating on an oblique part of the register, the last electrode of the last row of this column extends parallel to the beveled corner, the electrodes which precede this electrode having shapes intermediate between an oblique strip shape and a horizontal strip shape so as to facilitate the transmission of charges under these electrodes from the column to the register.

3. The image sensor as claimed in claim 2, wherein the last electrode of the last row of the matrix extends continuously along the horizontal part and the oblique parts of the register.

4. The image sensor as claimed in claim 1, wherein there are provided several metallic conductors extending along the register and coming into contact locally with the various charge transfer electrodes constituting the rows of the matrix.

5. The image sensor as claimed in claim 1, wherein the reading register possesses a central output, the reading register being divided into two half-registers operating in opposite senses so as to bring the charges from the left half of the matrix to the right and the charges from the right half to the left.

6. The image sensor as claimed in claim 1, wherein the chip is covered with a scintillator.

7. An intraoral dental radiological image capture device, comprising a sensor as claimed in claim 6.

8. An image sensor comprising:
    a matrix of rows and columns of photosensitive dots, made on a chip of general square or rectangular shape with beveled corners,
    a reading register placed on the chip at the bottom of the matrix, said register being bent so as to run alongside the beveled corners of the chip forming a horizontal part and two oblique parts, said register includes an input configured to store in parallel signals representative of exposure of pixels to light, and an output configured to serially output corresponding signals, and
    a structure for directing photosensitive charges of columns terminating opposite the beveled corners to register stages situated in the oblique parts alongside the beveled corners;
    wherein each row of the matrix comprises several electrodes extending in a linear strip and in that the ends of certain of these electrodes are bent so that, inside a column terminating on an oblique part of the register, the last electrode of the last row of this column extends parallel to the beveled corner, the electrodes which precede this electrode having shapes intermediate between an oblique strip shape and a horizontal strip shape so as to facilitate the transmission of charges under these electrodes from the column to the register.

* * * * *